United States Patent
Heberle et al.

(10) Patent No.: US 8,841,906 B2
(45) Date of Patent: Sep. 23, 2014

(54) CURRENT SENSOR AND METHOD FOR DETECTING A CURRENTLESS STATE

(71) Applicant: Micronas GmbH, Freiburg (DE)

(72) Inventors: Klaus Heberle, Emmendingen (DE); Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 150 days.

(21) Appl. No.: 13/657,063

(22) Filed: Oct. 22, 2012

(65) Prior Publication Data
US 2013/0099781 A1 Apr. 25, 2013

(30) Foreign Application Priority Data
Oct. 21, 2011 (DE) .................. 10 2011 116 544

(51) Int. Cl.
*G01R 33/07* (2006.01)
*G01R 33/00* (2006.01)
*G01R 33/09* (2006.01)

(52) U.S. Cl.
CPC ............ *G01R 33/09* (2013.01); *G01R 33/0029* (2013.01); *G01R 33/07* (2013.01)
USPC ............................ 324/251; 324/252; 327/510

(58) Field of Classification Search
CPC ................................. G01R 33/07; G01D 5/145
USPC ................................... 324/251, 252; 327/510
See application file for complete search history.

(56) References Cited

U.S. PATENT DOCUMENTS

| 5,315,293 | A | 5/1994 | Kamiya |
| 7,825,657 | B2 | 11/2010 | Rossmann et al. |
| 2009/0189575 | A1 | 7/2009 | Hallak |

FOREIGN PATENT DOCUMENTS

| DE | 42 19 025 A1 | 12/1992 |
| DE | 10 2004 010 613 A | 10/2005 |
| DE | 10 2006 017 479 A1 | 10/2007 |
| EP | 0 742 440 B1 | 2/2002 |
| JP | 57118661 A | 7/1982 |

*Primary Examiner* — Reena Aurora
(74) *Attorney, Agent, or Firm* — Muncy, Geissler, Olds & Lowe, P.C.

(57) ABSTRACT

A current sensor having a magnetic field sensor, and a variable current source connected to the magnetic field sensor, and a first differential amplifier, connected to the magnetic field sensor, for amplifying a first sensor voltage. A second differential amplifier is provided and the second differential amplifier is connected to the first differential amplifier and to the current source. In the case of the first sensor voltage, a first operating current is present at the magnetic field sensor and in the case of a second sensor voltage, a second operating current is present, whereby the second Hall voltage is smaller than the first sensor voltage and the second operating current is greater than the first operating current.

13 Claims, 2 Drawing Sheets

CURRENT SENSOR AND METHOD FOR DETECTING A CURRENTLESS STATE

This nonprovisional application claims priority under 35 U.S.C. §119(a) to German Patent Application No. DE 10 2011 116 544.8, which was filed in Germany on Oct. 21, 2011, and which is herein incorporated by reference.

BACKGROUND OF THE INVENTION

1. Field of the Invention

The present invention relates to a current sensor for detecting a currentless state and a method for detecting a currentless state with a current sensor.

2. Description of the Background Art

JP 57118661 A discloses a current sensor. Non-contact measurement of a current flowing in a conductor can be carried out with a current sensor of this type. In the simplest embodiment, a magnetic field generated by the current flow in a conductor can be measured with a Hall sensor alone. To reduce scattering effects and other interference effects, however, a ring is typically used which is made of a magnetic conductive material and has a slot in which a Hall sensor is disposed. If such a ring-shaped current sensor surrounds a conductor, the magnetic field generated by the conductor can be focused and the current flow in the conductor can be determined more precisely. However, the association between the magnetic field strength and the flux density in magnetically conductive material is not linear and the use of the current sensor is limited to a predetermined current range.

EP 0 742 440 B1 discloses a current sensor which is constructed according to the principle of a compensation current transformer. According to the compensation principle, the ring made of a magnetically conductive material is equipped with a winding through which a current is sent, which is intended to work against the current in the conductor with respect to the particularly generated magnetic field. In this case, this type of compensation current sensor is typically regulated so that the magnetic field present at the Hall sensor is regulated to zero. Therefore, the current flowing through the winding is directly proportional to the current to be measured and flowing in the conductor. At present, in this case, the Hall sensor is supplied with a constant operating current, so that with respect to its magnetic field sensitivity it is adjusted to a fixed sensitivity range.

In addition, DE 10 2004 010 613 A, which corresponds to U.S. Pat. No. 7,825,657, discloses a regulating system for a magnetic field sensor, in which the signals are processed digitally by means of a processor. Further, DE 10 2006 017 479 A1 (which corresponds to U.S. 20090189575) and DE 42 19 025 A1 (which corresponds to U.S. Pat. No. 5,315,293) disclose a method for measuring an alternating current or a method for detecting an overcurrent, respectively.

SUMMARY OF THE INVENTION

It is therefore an object of the present invention to provide a current sensor and a method for detecting a currentless state, which refines the state of the art.

According to an embodiment of the invention, a current sensor for detecting a currentless state is provided, having a magnetic field sensor, whereby the magnetic field sensor is configured as a Hall sensor or an AMR sensor, and a variable supply connected to the magnetic field sensor, whereby the supply is configured as a variable current source or as a variable voltage source, and a first differential amplifier, connected to the magnetic field sensor, for amplifying a first sensor voltage, whereby the first differential amplifier has an output, and the amplified analog sensor voltage is present at the output of the first differential amplifier, and a second differential amplifier, connected to the supply, with a first input and a second input is provided and the first input of the second differential amplifier is connected directly to the output of the first differential amplifier to the supply, and the second input of the second differential amplifier to a reference voltage, so that the amplified analog sensor voltage is present at the first input of the second differential amplifier and the first differential amplifier and the second differential amplifier and the magnetic field sensor with the supply form an analog control loop, and in the case of the first sensor voltage a first operating current or a first supply voltage is present at the magnetic field sensor and in the case of a second sensor voltage a second operating current is present or a second supply voltage is present, whereby the second sensor voltage is smaller than the first sensor voltage and the second operating current or the second supply voltage is greater than the first operating current or the first supply voltage.

According to another embodiment of the invention, a method is provided, designed to detect a currentless state and/or a zero-crossing by a conductor with a current sensor, whereby the current sensor has a magnetic field sensor and the magnetic field sensor is configured as a Hall sensor or as an AMR bridge, and a first differential amplifier with an output for amplifying a first sensor voltage, whereby the amplified analog sensor voltage is present at the output of the first differential amplifier, a second differential amplifier connected to the supply, with a first input and a second input is provided, whereby the first input of the second differential amplifier is connected directly to the output of the first differential amplifier and the second input of the second differential amplifier to a reference voltage, so that the amplified analog sensor voltage is present at the first input of the second differential amplifier and an analog control loop is formed by the first differential amplifier with the second differential amplifier and with the magnetic field sensor and with the supply and for the detection of a currentless state in a first state in the case of a drop in an electric current flowing through the conductor, a drop in a sensor voltage generated by the magnetic field sensor or Hall voltage is compensated at least partially by an increase in an operating current present at the magnetic field sensor or the present supply voltage by means of a variable supply.

It should be noted that the following embodiments are provided particularly for a Hall sensor as a magnetic field sensor, but the embodiments and advantages also relate to a magnetic field sensor and particularly also to an AMR bridge. It should be noted further that the Hall sensor or particularly the AMR bridge at an applied operating current or at an applied supply voltage generates a sensor voltage or particularly a Hall voltage only when the magnetic field lines running through the magnetic field sensor in a Hall sensor are at least partially orthogonal to the operating current flowing in the Hall sensor. It should be noted further that the term operating current or the term supply voltage very generally designates the operating current or very generally the supply voltage of the magnetic field sensor regardless of the specific level. In contrast, the term first operating current or first supply voltage and second operating current or second supply voltage each designate an operating current or a supply voltage of a predetermined level. Further, a currentless state is present when no current flows in the conductor to be measured or when the flowing current in the conductor undergoes a polarity reversal. A polarity reversal is taken to mean a change in the technical current direction in the conductor. In this type of polarity reversal as well, a currentless state is present for a brief period at the zero-crossing. Particularly in the broad zero-crossing region, therefore at very low current flows or very low current strengths, the magnetic field arising because of the low current flow has a very low magnetic flux density.

An advantage is that at a magnetic flux density reduced by the current sensor the Hall voltage can be kept nearly constant by means of an increase in the operating current or the supply voltage. In other words, because the second differential amplifier is connected to the current source or the voltage source and the reference voltage, a difference relative to the reference voltage causes an increase in the operating current or the supply voltage; i.e., the Hall sensor, the first differential amplifier, the second differential amplifier, and the current source or the voltage source form a control loop, whereby the level, associated with an actual value of the Hall voltage, of the operating current or the supply voltage is adjusted by means of the reference voltage level. If the Hall voltage deviates from the actual value, the operating current or the supply voltage is readjusted for rejection in an inverse ratio. In other words, in the present case this concerns an analog signal processing; i.e., the analog sensor voltage is amplified by means of a first differential amplifier and supplied to a second differential amplifier. The second differential amplifier controls a variable supply with the analog output voltage, whereby the variable supply controls the magnetic field sensors also by means of an analog signal. As a result, the analog control loop is formed. An advantage of the analog control loop is that the control loop responds much more rapidly to a change in the magnetic flux, than when a digital signal processing is formed within the control loop. Because the digital signal processing becomes unnecessary, the manufacturing costs can be reduced and the reliability of the arrangement increased.

Tests have shown that as a result a zero-crossing, i.e., a currentless state of a conductor can be detected in an especially reliable and simple manner. An excessive long increase in the operating current or the supply voltage and a resulting possibly associated great temperature increase in the Hall sensor are generally prevented by a rapid passing of the zero-crossing in the conductor at an applied alternating voltage frequency of about 50 Hz. Tests have shown that slowly alternating voltages as well in the range up to 1 Hz can be readily detected. Further, according to an embodiment, a current-limited device can also be used.

According to an embodiment, the Hall sensor has a first output and a second output and the first differential amplifier an output and a first input connected to the first output of the Hall sensor and a second input connected to the second output of the differential amplifier, whereby the first Hall voltage or the second Hall voltage is present between the first output and the second output of the Hall sensor.

In an embodiment, the second differential amplifier has a first input, a second input, and an output, whereby the first input of the second differential amplifier is connected to the output of the first differential amplifier and the second input of the second differential amplifier is connected to the reference voltage. Because the amplified analog sensor voltage of the magnetic field sensor or the amplified Hall voltage is present at the output of the first differential amplifier and the output of the first differential amplifier is connected directly to the first input of the second differential amplifier, the amplified analog sensor voltage is present at the first input of the second differential amplifier. Further, the analog output of the second differential amplifier is connected to the control input of the variable supply and the supply to the magnetic field sensor. In other words, all signal paths of the control loop are made in an analog manner. The sensitivity of the arrangement particularly for the temporally variable magnetic fluxes can be increased by the very rapid regulation of the supply voltage or the operating current.

In a further embodiment, the supply has an output and a control input, whereby the output of the supply is connected to the Hall sensor and the control input is connected to the output of the second differential amplifier.

In a further embodiment, in a second state in the case of an increase in an electric current flowing through the conductor, an increase in sensor voltage generated by the magnetic field sensor or Hall voltage is compensated at least partially by reducing the operating current present at the magnetic field sensor by means of the variable supply, whereby the magnetic field sensor is configured as a Hall sensor or as an AMR bridge.

The supply can adjust the operating current or the supply voltage for a first predetermined time to a predetermined first value, when the operating current or the supply voltage reaches or exceeds a threshold value. Further, the supply adjusts the operating current or the supply voltage for a second predetermined time to a predetermined second value, when the generated Hall voltage reaches or falls below a first threshold value. Because the supply clamps the operating current or the supply voltage to the first value for a first time period (first predetermined time) or the second value for the second time period (first predetermined time), an overheating of the Hall sensor due to a too high operating current or a too high supply voltage can be reliably prevented. In this way, more or less long time periods during which the first conductor is currentless can also be readily detected with the current sensor or with the method. Further, a dead time of the current sensor is prevented. Dead time in this regard designates a time period during which the Hall sensor becomes currentless and hereby, for example, cools.

Alternatively, i.e., in a change to one of the aforementioned operating modes, an operating current too high for normal operation or continuous operation can also be applied briefly at the Hall sensor to increase the sensitivity of the current sensor briefly particularly in the region of the zero-crossing. Time periods of less than 5 seconds, preferably of less than 0.5 seconds, are designated as brief. The region of the currentless state in a zero-crossing, in which only very low magnetic flux densities are encountered, however, is limited very narrowly in time; i.e., the Hall sensor to improve the sensitivity is also supplied only briefly with a high operating current, damaging during continuous operation, or damaging supply voltage. As a result, the Hall voltage can be prevented from decreasing at least briefly, therefore kept constant.

According to an embodiment, the supply changes the polarity of the operating current or the polarity of the supply voltage, when the zero-crossing occurs in the conductor. An advantage of the embodiment is that the sign of the Hall voltage remains the same.

In an embodiment, the zero-crossing is detected by a sign change in the Hall voltage. An advantage is that based on the sign change a reversal of the current direction in the first conductor can be clearly detected. Alternatively, the zero-crossing is detected, when the Hall voltage reaches or falls below a predetermined second threshold value.

Tests by the applicant have shown that the current sensor or the method can be used to change a switching state of an electrical device or an electrical circuit as a function of the zero-crossing. Because a zero-crossing in the current can now be determined reliably and without contact, in contrast to a zero-voltage switch the time during which the current flow is precisely zero or at least nearly zero is determined precisely also in a phase shift between current and voltage in the first conductor. As a result, particularly with an alternating voltage engines or particularly electrical devices, which have a high power consumption, can be turned on and/or off at an optimal time. A contact burn due to spark formation is reliably suppressed. A further advantage is that especially protective elements such as, for example, flyback diodes can be economized.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
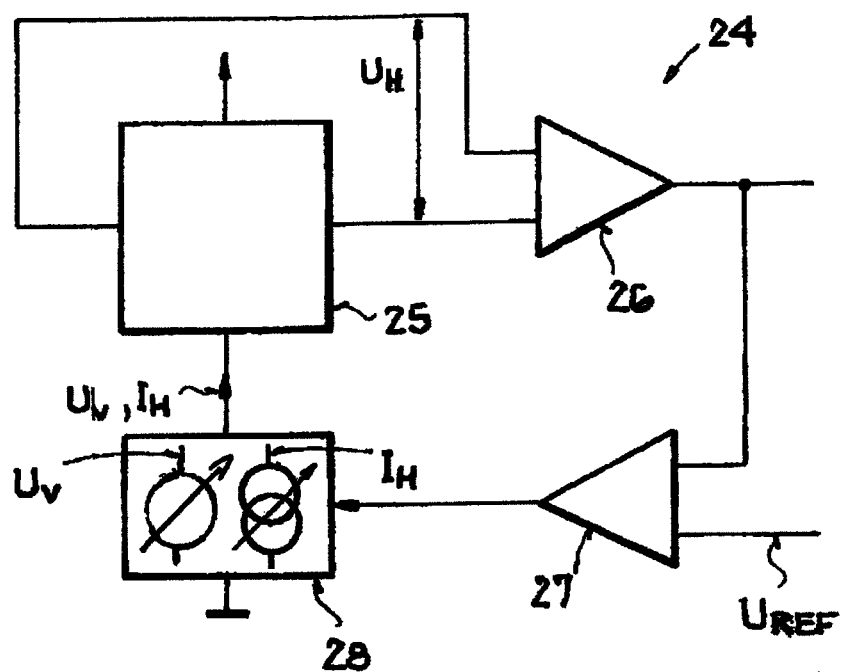
FIG. 1 shows a highly simplified circuit diagram for a current sensor.

The illustration in FIG. 1 shows a highly simplified circuit diagram of a current sensor 24, having a Hall sensor 25, with a first output and a second output, whereby a Hall voltage UH is present between the first output and the second output, having a variable supply 28, which is configured as a current source or as a voltage source, with an output and a control input, whereby the output of supply 28 is connected to Hall sensor 25 and supplies Hall sensor 25 with an operating current IH or a supply voltage UV, having a first differential amplifier 26, with a first input and a second input and an output, whereby the Hall voltage UH is present between the first input and the input, and having a second differential amplifier 27 with a first input and a second input and an output, whereby the first input of second differential amplifier 27 is connected to the output of first differential amplifier 26, and a reference voltage UREF is present at the second input of second differential amplifier 27 and the output of second differential amplifier 27 is connected to the control input. The Hall voltage UH is generated in particular by means of the magnetic flux, penetrating Hall sensor 25, of a current-carrying conductor (not shown).

The Hall voltage UH is amplified by means of first differential amplifier 26 and is applied at the output of first differential amplifier 26 in amplified form. The amplified Hall voltage UH' is compared with the reference voltage UREF by second differential amplifier 27. The greater the difference between the amplified Hall voltage UH' and the reference voltage UREF, the more greatly the operating current IH or the supply voltage UV is increased by supply 28 by means of the output signal of second differential amplifier 27 which is applied at the control input of current source 28.

Tests have shown that a sign change in the Hall voltage UH can be easily detected with second differential amplifier 27 and the reference voltage UREF and the polarity reversal of the operating current IH or the supply voltage UV can be controlled by means of variable supply 28, with which Hall sensor 25 is supplied. Supply 28 can be affected by means of second differential amplifier 27 in such a way that in the case of a predetermined direction of a sign change of the Hall voltage UH, supply 28 undertakes a polarity reversal of the operating current IH or the supply voltage UV, whereas with an opposite sign change this type of polarity reversal of the operating current IH or the supply voltage UV does not occur.

Figure 2A:
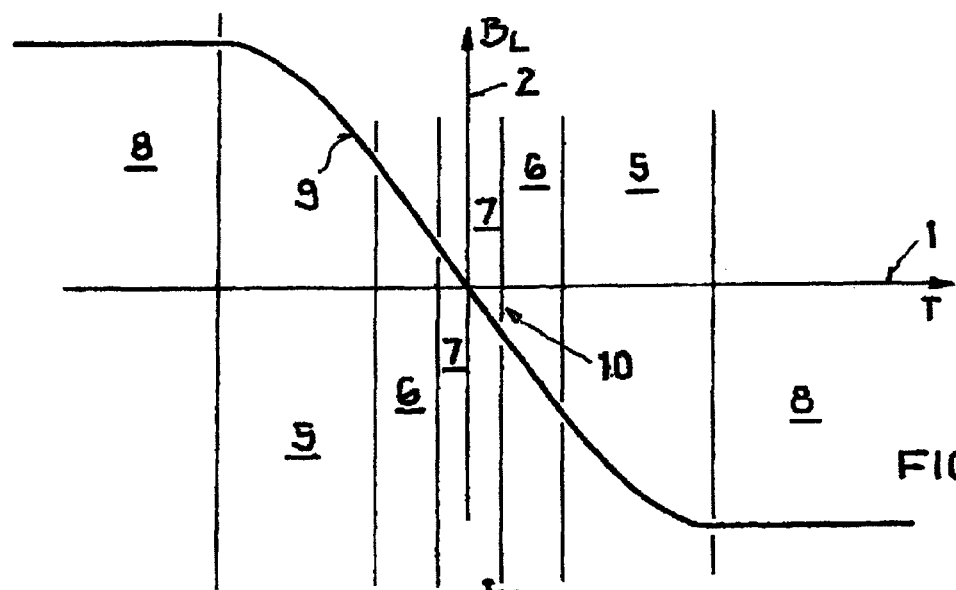
FIGS. 2a, b, c show a schematic view of the current sensor according to an embodiment of the invention.

In the illustration of FIGS. 2a, b, c, selected voltage curves are shown as a function of, for example, the magnetic field generated by the conductor. Only the differences relative to the embodiment in FIG. 1 will be described below. It should be noted that in the illustrations the supply voltage UV can also be plotted in each case instead of the operating current IH. The time T is plotted on each abscissa 1 of FIGS. 2a, 2b, and 2c. The course of the magnetic flux density BL of the conductor is plotted on an ordinate 2 in FIG. 2a. The operating current IH is plotted on an ordinate 3 of FIG. 2b and the Hall voltage UH on an ordinate 4 of FIG. 2c. A further zero-crossing region 5 is formed between times T1 and T'1, whereby the time period is also called the first predetermined time, whereas a narrower zero-crossing region 6 is formed by times T2 and T'2, whereby the time period is also called the second predetermined time, and a pulse region 7 by times T3 and T'3, whereby the time period is also called the third predetermined time. A so-called normal current region 8 is formed beyond times T1 and T'1.

A course 9 of magnetic flux density BL, as drawn in FIG. 2a, in the conductor, which undergoes a polarity reversal, has a constant magnetic flux density BL in the normal current region 8. At time T1, the magnetic flux density BL begins to decrease and at a zero-crossing 10, characterized by the intersection of curve 9 of the magnetic flux density BL with abscissa 1 and ordinate 2, experiences a sign change, whereby in the normal current region 8 over the further course a constant value of the magnetic flux density with a reverse sign again arises.

Figure 2B:
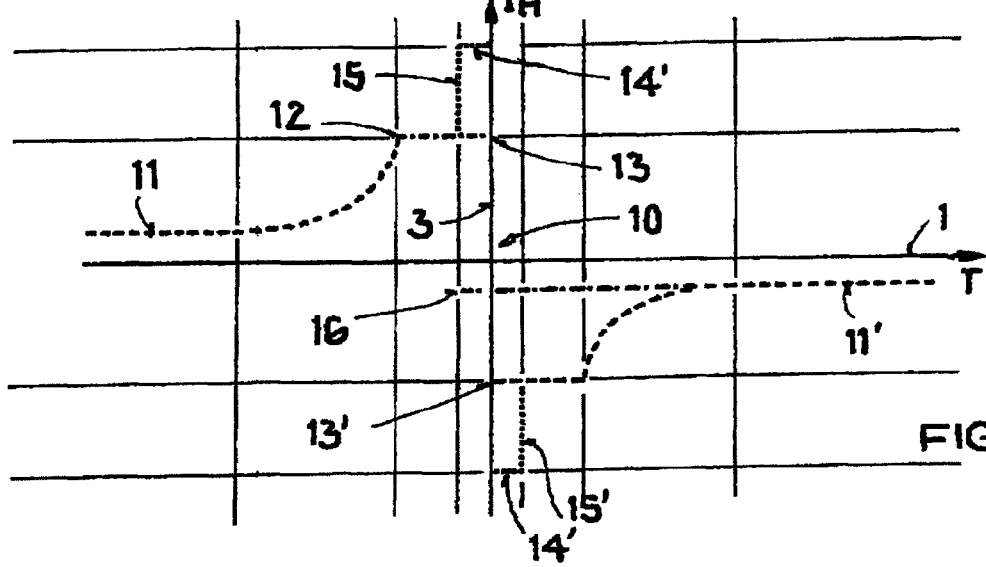

The operating current curve 11, as shown in FIG. 2b, has a constant value in the normal current region 8. In the broad zero-crossing region 5, the operating current IH increases, so that a drop in the Hall voltage UH is compensated at least partially. If the operating current IH according to the operating current curve 11 at time T2 now reaches a threshold value 12, a predetermined first value 13 of operating current IH arises and the operating current curve 11 has the constant first value 13 in the narrow zero-crossing region 6.

In a different operating mode, at time T3 a second value 14 of the operating current IH arises and according to an operating current curve 15, a short current strength pulse is emitted. After zero-crossing 10, the operating current IH can be continued also with the opposite sign as an operating current curve 15 and the operating current IH can be set briefly to a second value 14' with an opposite sign.

In an alternative operating mode, after zero-crossing 10 an operating current curve 11' occurs. The operating current IH can be adjusted within the narrow zero-crossing region 6 to a first value 13', with an opposite sign, of the operating current IH. Further, it is also conceivable that immediately after zero-crossing 10 the operating current IH is adjusted to a second value 16, which corresponds to the operating current IH in normal current region 8.

Figure 2C:
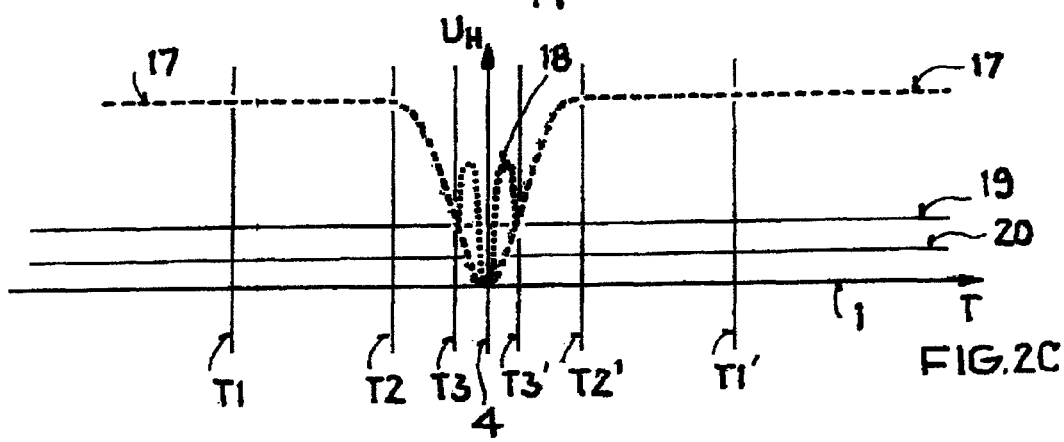

A Hall voltage curve 17, as shown in FIG. 2c, has a constant Hall voltage UH both in the normal current region 8 and in the broad zero-crossing region 5. In this regard, the constant Hall voltage in the broad zero-crossing region 5 is to be attributed to the increase in the operating current IH according to the operating current curve 11 as shown in FIG. 2b.

According to the other operating mode, a drop in the Hall voltage UH occurs in the narrow zero-crossing region 6 when the operating current IH is limited to the first value 13 or to the first value 13' with the opposite sign.

In the alternative operating mode, according to the operating current curve 15 or 15' a current strength pulse is fed in and a Hall voltage curve 18 arises. It is preferred to trigger a current strength pulse when the Hall voltage UH reaches or falls below a first threshold value 19.

Further, it is preferred to detect the zero-crossing in the current flow of the conductor or the currentless state thereof, when the Hall voltage UH reaches or falls below a second threshold value 20.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A current sensor for detecting a currentless state, the current sensor comprising:
   a magnetic field sensor;
   a variable supply connected to the magnetic field sensor;
   a first differential amplifier connected to the magnetic field sensor, the first differential amplifier amplifying a first sensor voltage, the first differential amplifier having an output that provides an amplified analog sensor voltage; and
   a second differential amplifier connected to the supply, the second differential amplifier having a first input and a second input,
   wherein the first input of the second differential amplifier is connected directly to the output of the first differential amplifier and the second input of the second differential amplifier is connected to a reference voltage so that the amplified analog sensor voltage is provided at the first input of the second differential amplifier,
   wherein the first differential amplifier, the second differential amplifier, and the magnetic field sensor with the variable supply form an analog control loop;
   wherein, in the case of the first sensor voltage, a first operating current or a first supply voltage is provided at the magnetic field sensor, and, in the case of a second sensor voltage, a second operating current or a second supply voltage is provided, and
   wherein the second sensor voltage is smaller than the first sensor voltage and the second operating current or the second supply voltage is greater than the first operating current or the first supply voltage.

2. The current sensor according to claim 1, wherein the magnetic field sensor is a Hall sensor or an AMR sensor, and wherein the first sensor voltage in the Hall sensor is a first Hall voltage and the second sensor voltage is a second Hall voltage.

3. The current sensor according to claim 2, wherein the Hall sensor has a first output and a second output, wherein the first differential amplifier has an output and a first input connected to the first output of the Hall sensor, wherein the Hall sensor has a second input connected to the second input of the first differential amplifier, and wherein the first Hall voltage or the second Hall voltage is present between the first output and the second output of the Hall sensor.

4. The current sensor according to claim 1, wherein the variable supply adjusts the operating current or the supply voltage for a predetermined time to a predetermined first value when the operating current or the supply voltage exceeds a threshold value.

5. The current sensor according to claim 4, wherein the supply has an output and a control input and the output of the supply is connected to the Hall sensor, and wherein the control input is connected to the output of the second differential amplifier.

6. The current sensor according to claim 1, wherein the current sensor changes a switching state of an electrical device or an electrical circuit as a function of a zero-crossing.

7. A method for detecting a currentless state or a zero-crossing by a conductor having a current sensor, the current sensor having a magnetic field sensor, the magnetic field sensor being configured as a Hall sensor or as an AMR bridge, and the method comprising:
   providing a first differential amplifier with an output for amplifying a first sensor voltage;
   providing an amplified analog sensor voltage at the output of the first differential amplifier;
   providing a second differential amplifier, which is connected to a supply, with a first input and a second input, the first input of the second differential amplifier being connected directly to the output of the first differential amplifier and the second input of the second differential amplifier being connected to a reference voltage so that the amplified analog sensor voltage is provided at the first input of the second differential amplifier and an analog control loop is formed by the first differential amplifier, the second differential amplifier, the magnetic field sensor, and the supply;
   detecting a currentless state in a first state in the case of a drop in an electric current flowing through the conductor; and
   compensating for a drop in a sensor voltage generated by the magnetic field sensor or Hall voltage at least partially by an increase in an operating current provided at the magnetic field sensor or the present supply voltage by a variable supply.

8. The method according to claim 7, wherein, in a second state, in the case of an increase in an electric current flowing through the conductor, an increase in sensor voltage generated by the magnetic field sensor or Hall voltage is compensated at least partially by reducing the operating current present at the magnetic field sensor or the present supply voltage via the variable supply, and wherein the magnetic field sensor is configured as a Hall sensor or an AMR bridge.

9. The method according to claim 7, wherein the supply adjusts the operating current or the supply voltage for a first predetermined time to a predetermined first value when the operating current or the supply voltage reaches or falls below a threshold value.

10. The method according to claim 7, wherein the supply adjusts the operating current or the supply voltage for a second predetermined time to a predetermined second value when the generated Hall voltage reaches or falls below a first threshold value.

11. The method according to claim 7, wherein the variable supply changes a polarity of the operating current or the supply voltage when a zero-crossing occurs in the conductor.

12. The method according to claim 7, wherein a zero-crossing is detected by a sign change in the Hall voltage.

13. The method according to claim 7, wherein a zero-crossing is detected when the Hall voltage reaches or falls below a predetermined second threshold value.

* * * * *